(12) United States Patent
Denta et al.

(10) Patent No.: US 9,431,326 B2
(45) Date of Patent: Aug. 30, 2016

(54) SEMICONDUCTOR DEVICE AND MANUFACTURING METHOD THEREOF

(75) Inventors: Toshio Denta, Matsumoto (JP); Tadanori Yamada, Matsumoto (JP); Eiji Mochizuki, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 195 days.

(21) Appl. No.: 13/984,971

(22) PCT Filed: Mar. 30, 2012

(86) PCT No.: PCT/JP2012/058627
§ 371 (c)(1),
(2), (4) Date: Aug. 22, 2013

(87) PCT Pub. No.: WO2012/137685
PCT Pub. Date: Oct. 11, 2012

(65) Prior Publication Data
US 2013/0334672 A1 Dec. 19, 2013

(30) Foreign Application Priority Data
Apr. 1, 2011 (JP) .................................. 2011-082168

(51) Int. Cl.
| H01L 23/495 | (2006.01) |
| H01L 25/07 | (2006.01) |
| H01L 21/50 | (2006.01) |
| H01L 23/31 | (2006.01) |
| H01L 25/16 | (2006.01) |

(52) U.S. Cl.
CPC ............. *H01L 23/495* (2013.01); *H01L 21/50* (2013.01); *H01L 25/072* (2013.01); *H01L 23/3107* (2013.01); *H01L 23/49537* (2013.01); *H01L 25/165* (2013.01); *H01L 2224/4903* (2013.01); *H01L 2924/1305* (2013.01); *H01L 2924/13055* (2013.01)

(58) Field of Classification Search
CPC ........................................................ H01L 23/495
See application file for complete search history.

(56) References Cited

U.S. PATENT DOCUMENTS 6,313,598 B1 * 11/2001 Tamba et al. ................. 318/722
2002/0008312 A1    1/2002 Sasaki et al.
2006/0060982 A1 *  3/2006 Ikawa et al. .................. 257/779

FOREIGN PATENT DOCUMENTS

| JP | 2000-133768 A | 5/2000 |
| JP | 2006-093255 A | 4/2006 |
| JP | 2009-021286 A | 1/2009 |

OTHER PUBLICATIONS

Starpower Semiconductor Ltd. Power Modules May 17, 2010; Starpower ID-IPM Application Note; Application Note AN ### Rev. 02.

*Primary Examiner* — William Harriston
(74) *Attorney, Agent, or Firm* — Manabu Kanesaka

(57) ABSTRACT

In a semiconductor device, semiconductor chips and lead frames are soldered at the same time on an insulating circuit board by one reflow soldering, and the positions of the externally led out lead frames undergo no change. In manufacturing the semiconductor device, after power semiconductor chips and control ICs are mounted on an insulating circuit board, and lead frames are disposed thereon, the semiconductor chips and lead frames are soldered at the same time on the insulating circuit board by one reflow soldering. Furthermore, after a primary bending work is carried out on the lead frames, and a terminal case is mounted over the insulating circuit board, a secondary bending work is carried out on the lead frames.

7 Claims, 16 Drawing Sheets

FIG.7 (A)
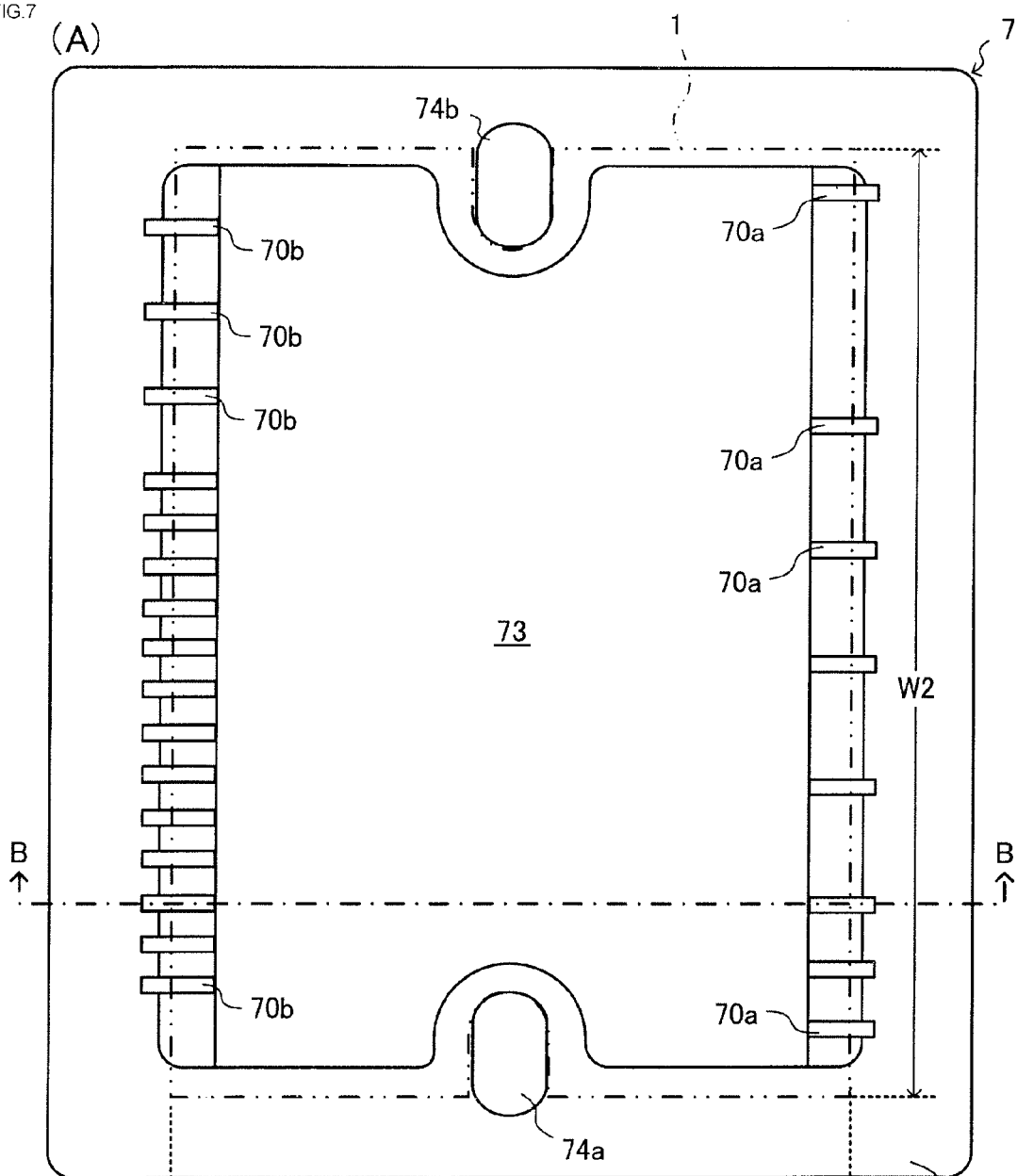
(B)
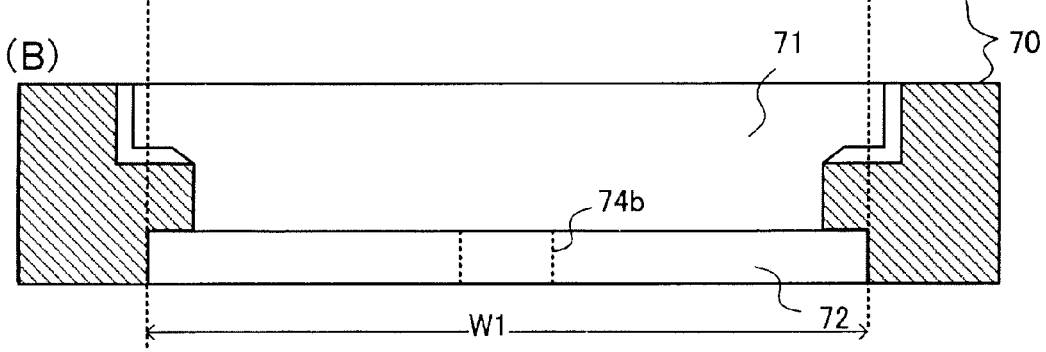

the present invention is characterized in that circuit patterns are formed on the insulating circuit board by direct copper bonding, and the control integrated circuits and power semiconductor elements are disposed on the circuit patterns.

SEMICONDUCTOR DEVICE AND MANUFACTURING METHOD THEREOF

RELATED APPLICATIONS

The present application is National Phase of International Application No. PCT/JP2012/058627 filed Mar. 30, 2012, and claims priority from Japanese Applications No. 2011-082168 filed Apr. 1, 2011.

TECHNICAL FIELD

The present invention relates to a semiconductor device configured from a plurality of power semiconductor elements and control integrated circuits which control the power semiconductor elements mounted on an insulating circuit board, and a manufacturing method thereof, and particularly relates to a power semiconductor module configured by packaging a plurality of power semiconductors and their control integrated circuits.

BACKGROUND ART

A power semiconductor module packaged independently of the main body of the semiconductor device is used in a semiconductor device which electronically controls an inverter device, an uninterruptible power system, a working machine, an industrial robot, or the like. The power semiconductor module is configured by mounting semiconductor chips acting as various kinds of power semiconductor elements, such as insulated gate bipolar transistors (hereafter presented as "IGBTs"), configuring a power converter circuit on an insulating circuit board, and packaging the insulating circuit board. Furthermore, control integrated circuits which control the power semiconductor elements are also mounted on the insulating circuit board and included in the package, thereby configuring an intelligent power module (IPM) (for example, refer to PTL 1).

This kind of power semiconductor module is generally configured in the following way. Firstly, semiconductor chips are mounted on circuit patterns on an insulating circuit board by soldering. Ends of external terminals formed integrally with a terminal case are also joined to the circuit patterns on the insulating circuit board. The semiconductor chips and circuit patterns, the circuit patterns and external terminals, or the semiconductor chips and external terminals are wire bonded using metal wires, and the inside of the terminal case is injected and sealed with a resin, thereby performing a packaging. Also, an arrangement is made such that it is possible to release heat generated in the power semiconductor elements to the exterior by a radiating surface provided on the side opposite from portions of the terminal case in which the external terminals are mounted to abut against cooling fins or the like.

Alternatively, in another power semiconductor module manufacturing method, power semiconductor elements (semiconductor chips) and control integrated circuits (hereafter referred to as control ICs) are firstly mounted on an insulating circuit board. Meanwhile, a lead frame formation body is set in a predetermined mold, and a terminal case with which a lead frame is insert molded integrally by a resin injection molding is prepared. An internal terminal and an external terminal are molded in advance for each of leads of the lead frame by a press work. Subsequently, a reflow soldering treatment is carried out by abutting the external terminals and internal terminals of the integrally formed lead frame against corresponding solder layers in a condition in which the insulating circuit board mounted with the control integrated circuits (hereafter referred to as the control ICs) and power semiconductor chips are mounted in the terminal case. Consequently, by this one reflow soldering, the semiconductor chips are soldered to the top of the insulating circuit board, and at the same time, it is possible to carry out a soldering of the semiconductor chips to the internal terminals of the leads without carrying out a wire bonding (refer to PTL 1).

CITATION LIST

Patent Literature

PTL 1: Japanese Patent publication JP-A-2006-93255 (paragraph numbers [0009] to [0017] and FIG. 1)

SUMMARY OF INVENTION

Technical Problem

However, when power semiconductor elements are reduced in size, or integrated control ICs are further reduced in size, the size of an insulating circuit board for mounting them decreases even further. Because of this, the disposition of circuit patterns formed on the insulating circuit board is also changed, meaning that soldering positions for connecting a lead frame to the control ICs and power semiconductor chips are changed.

Also, when the lead frame is insert molded integrally with the terminal case in advance, as in the power semiconductor module in the heretofore known method, the positions of the internal terminals of the lead frame are changed in accordance with a change in the circuit pattern disposition of the insulating circuit board. Because of this, the shape of the lead frames punched out by a press work is changed, in accordance with that, positions from which the external terminals are led out must be changed. Consequently, there has been a problem in that a change in position occurs in a step of mounting the external terminals of the power semiconductor elements on a control circuit board of an inverter device, uninterruptible power system, working machine, industrial robot, or the like.

The invention, having been contrived bearing in mind this kind of point, has an object of providing a semiconductor device wherein power semiconductor chips and lead frames are soldered at the same time on an insulating circuit board by one reflow soldering, and the positions of the externally led out lead frames undergo no change.

Also, the invention has an object of providing a semiconductor device manufacturing method whereby it is possible to efficiently manufacture a semiconductor device which includes a plurality of power semiconductor chips inside, and on a control circuit board of a main body of which control integrated circuits are mounted.

Solution to Problem

In order to solve the heretofore described problems, the invention provides a semiconductor device including an insulating circuit board mounted with a plurality of power semiconductor elements and control integrated circuits controlling the power semiconductor elements; lead frames each configuring an external terminal on one end side, and configuring an internal terminal connected to a semiconductor chip on the other end side; and a terminal case holding an internal terminal side of each of the lead frames, wherein the insulating circuit board and the internal terminal side of each of the lead frames are housed in the terminal case, and an inside of the terminal case is sealed with a resin.

In the semiconductor device, the terminal case is formed with a resin filling portion for resin sealing including a connecting surface of the insulating circuit board connected to the lead frames, each of the lead frames is bent into an L shape facing an inner side surface of the resin filling portion, and lead out positions of the external terminals are maintained constant regardless of positions in which the insulating circuit board and the lead frames are connected in the terminal case.

Also, a semiconductor device manufacturing method of the invention is configured by mounting a plurality of power semiconductor elements and control integrated circuits controlling the power semiconductor elements on an insulating circuit board, housing the insulating circuit board and internal terminal sides of lead frames connected to the insulating circuit board in a terminal case, and resin sealing an inside of the terminal case, wherein the terminal case includes a board housing portion in which the insulating circuit board is mounted, a resin filling portion which is filled with a resin, and a through hole which connects the board housing portion and the resin filling portion. The method includes a step of solder joining the power semiconductor elements, the control integrated circuits, and lead frame formation bodies to the insulating circuit board; a primary bending step of bending the lead frames vertically with respect to a main surface of the insulating circuit board at an inner side than the through hole; a step of mounting the insulating circuit board in the terminal case; a secondary bending step of bending the lead frames along inner side surfaces of the resin filling portion of the terminal case; and a step of filling the resin filling portion with a sealing resin.

Advantageous Effects of Invention

According to the semiconductor device and manufacturing method of the invention, even when the insulating circuit board is reduced in size, it is possible to correspond without changing the size of the lead frames themselves. Moreover, as it is possible to configure a semiconductor device by incorporating an insulating circuit board differing in size without changing positions from which the lead frames are led out externally, there is no more need for a change in position in a step of mounting the semiconductor device on a control circuit board.

The heretofore described and other objects, features, and advantageous effects of the invention will be clarified by the following description relating to the attached drawings illustrating a preferred embodiment as an example of the invention.

BRIEF DESCRIPTION OF DRAWINGS

FIGS. 7(A), 7(B) are diagrams showing a shape of a terminal case for mounting the insulating circuit board, wherein FIG. 7(A) is a plan view thereof, and FIG. 7(B) is a sectional view taken along the line B-B of FIG. 7(A), looking in the direction of the arrows.

DESCRIPTION OF EMBODIMENTS

Figure 1:
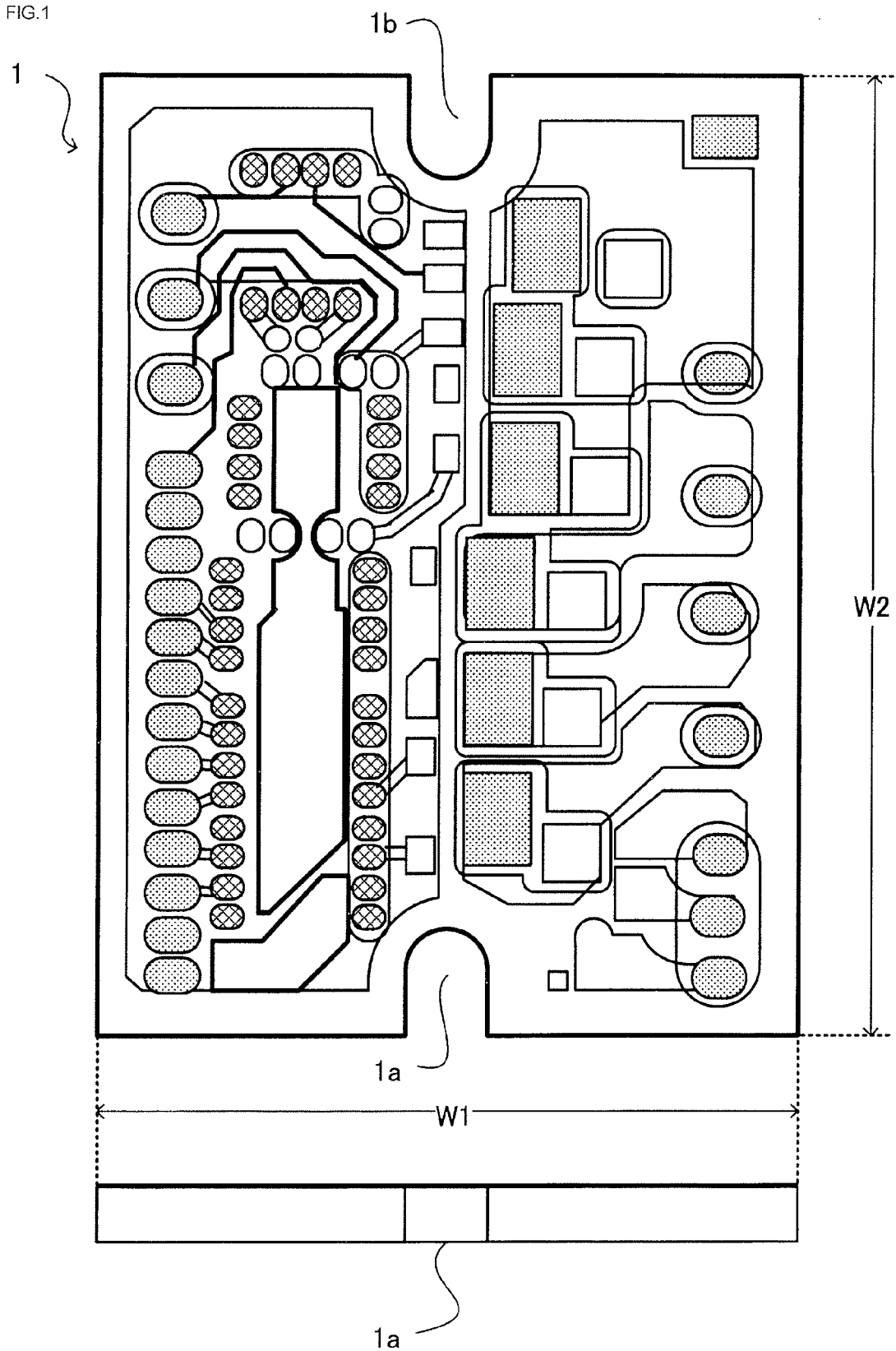
FIG. 1 illustrates a plan view showing a shape of an insulating circuit board on which are formed circuit patterns of a semiconductor device according to an embodiment, and a front view thereof.

Hereafter, referring to the drawings, a description will be given for embodiments of the invention. FIG. 1 illustrates a plan view showing a shape of an insulating circuit board on which are formed circuit patterns of a semiconductor device according to the embodiment, and a front view of the insulating circuit board.

A metal insulating substrate made of aluminum or copper is used as a base substrate of the insulating circuit board 1 configuring a power semiconductor module. In general, the insulating circuit board is not particularly limited to the planar shape, but in this example, the insulating circuit board has a rectangular shape of which the lateral width is W1 and the longitudinal length is W2 (>W1). This is employed in order to increase the degree of freedom in disposing lead frames acting as external terminals by taking edges not provided with notched portions 1a and 1b, to be described hereafter, to be in a long edge direction. Also, edges provided with the notched portions 1a and 1b may be taken to be in the long edge direction, provided that it is possible to secure a predetermined distance (insulation distance) from the notched portions.

An insulating layer is formed on an upper surface of the base substrate. An insulating resin layer made of, for example, an epoxy resin containing a highly thermally conductive filler (powder of aluminum nitride, silicon dioxide, or the like) is formed as the insulating layer. As shown in FIG. 1, a plurality of metal patterns made of a copper foil configuring electrode portions and wiring layers is formed on the insulating layer. Circuit parts configuring the semiconductor device, for example, power semiconductor chips and the control ICs thereof, are disposed in predetermined positions on the metal patterns of the insulating circuit board 1.

The notched portions 1a and 1b of a recess shape are formed respectively in both front and back short edges of the insulating circuit board 1, and correspond to screw insertion holes of a terminal case (FIGS. 7A, 7B) to be described hereafter. Also, as electrodes and wires themselves do not constitute the scope of the invention, FIG. 1 illustrates one example of the metal patterns in a simplified form, and the disposition of the metal patterns can be changed as appropriate.

An example has been shown wherein the insulating circuit board 1 is configured as a metal insulating substrate wherein an insulating resin layer is deposited on a base substrate made of a metal (copper or aluminum), but the insulating circuit board 1 may be configured as a DCB (Direct Copper Bond) insulating substrate wherein a ceramic substrate is used as a base substrate, and metal circuit patterns are disposed on each surface of the ceramic substrate.

Figure 2:
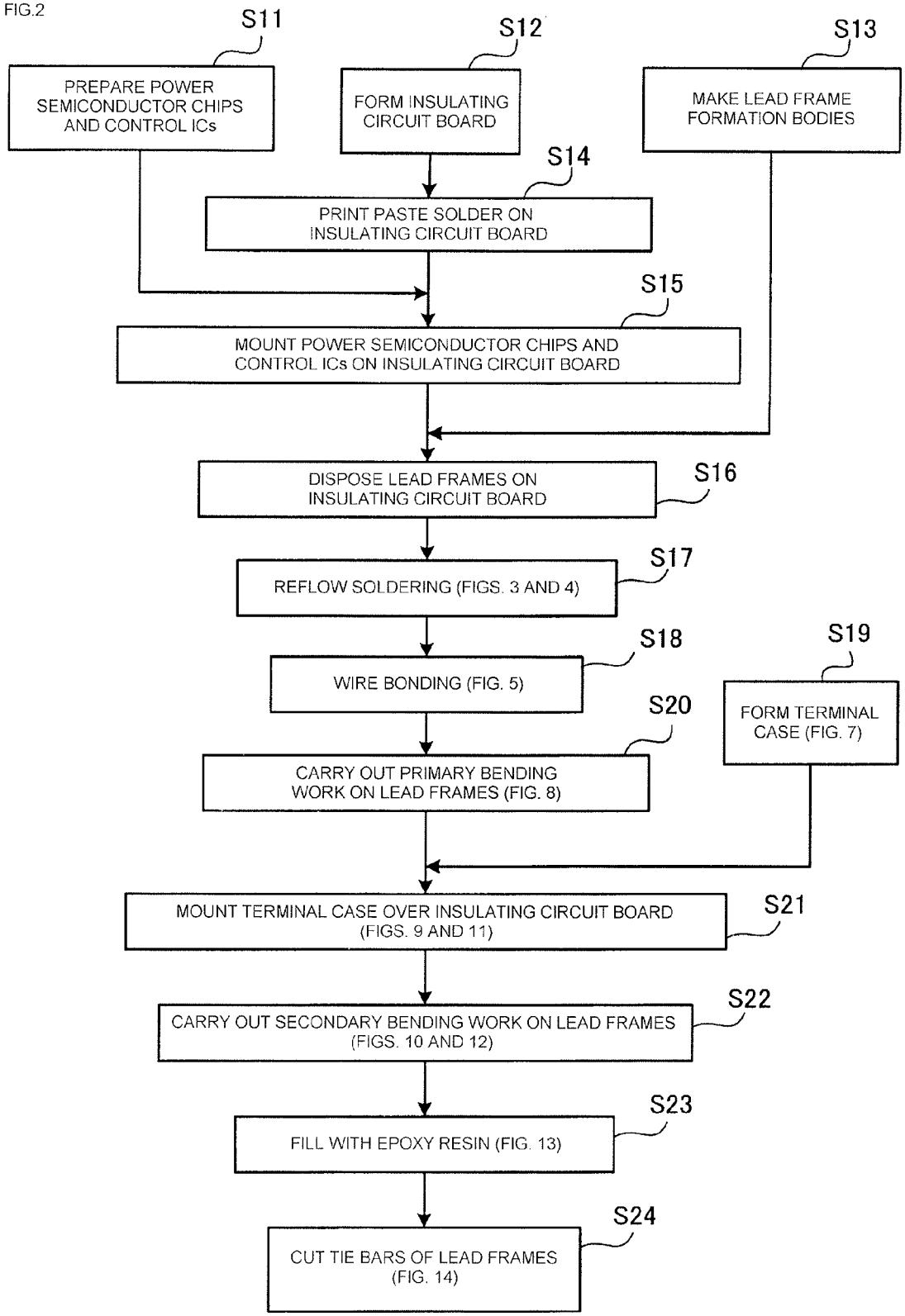
FIG. 2 is a flowchart showing an outline of a process of manufacturing the semiconductor device.

FIG. 2 is a flowchart showing an outline of a process of manufacturing the semiconductor device. Hereafter, a description will be given in accordance with step numbers (hereafter, each represented as "S") indicating the manufacturing steps of FIG. 2.

In S11, power semiconductor chips and the control ICs thereof are prepared.

In S12, the kind of insulating circuit board 1 shown in FIG. 1 is formed.

In S13, a copper plate of a predetermined rectangular shape is punched out by a press work to make lead frame formation bodies (FIG. 3) to be described hereafter. These steps S11 to S13 are implemented in parallel.

In S14, solder layers are screen printed in predetermined positions on the metal patterns of the insulating circuit board 1. In S15, the power semiconductor chips and control ICs prepared in step S11 are mounted in predetermined positions on the insulating circuit board 1.

In S16, a pair of lead frame formation bodies 2a and 2b made in step S13 is disposed on electrode portions disposed along the long edges of the insulating circuit board 1. In this condition, the process moves to step S17, and a reflow soldering is carried out. Subsequent steps S17 to S24 will be described sequentially using FIGS. 3 to 14.

Figure 3:
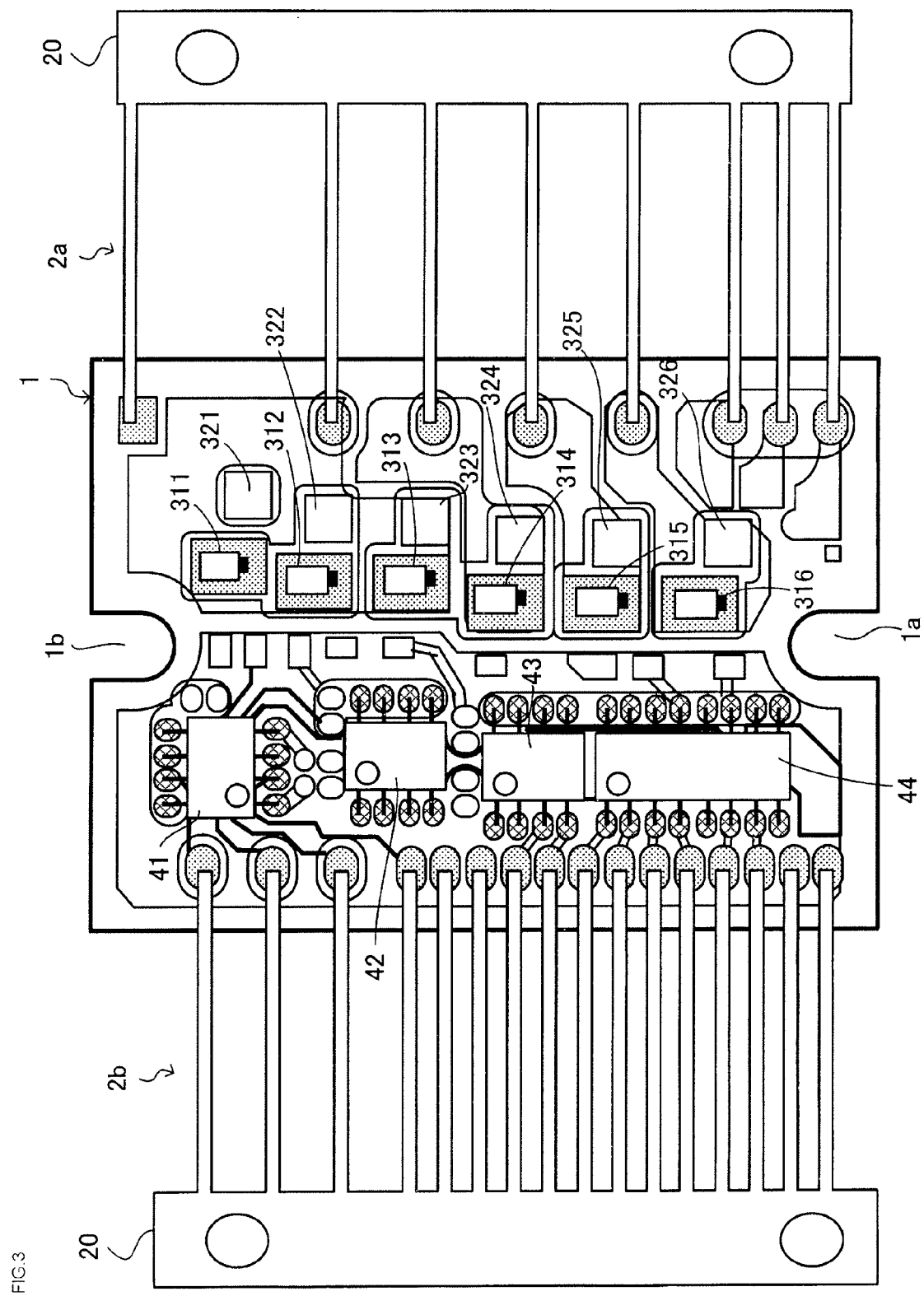
FIG. 3 is a plan view showing a reflow soldering step which bonds lead frames and the like to the insulating circuit board.

FIG. 3 is a plan view showing a reflow soldering step which bonds the lead frames and the like to the insulating circuit board.

Herein, IGBTs 311 to 316, FWDs (Free Wheeling Diodes) 321 to 326 connected in inverse parallel to the respective IGBTs, and four large and small control ICs 41 to 44 are disposed with the IGBTs and FWDs and the control ICs separated into right and left sides, and surface mounted, on the insulating circuit board 1 as the power semiconductor chips. Also, the lead frame formation body 2a is disposed in a condition in which the internal terminal sides thereof are abutted against electrodes in the vicinity of a long edge on the side of the power semiconductor chips (IGBTs 311 to 316 and FWDs 321 to 326), while the lead frame formation body 2b is disposed in a condition in which the internal terminal sides thereof are abutted against electrodes in the vicinity of a long edge on the side of the control ICs 41 to 44, and a reflow soldering is carried out. By so doing, the insulating circuit board 1 and the power semiconductor chips (IGBTs 311 to 316 and FWDs 321 to 326) and control ICs 41 to 44 are soldered together, and at the same time, the insulating circuit board 1 and the lead frame formation bodies 2a and 2b are soldered together.

By this soldering, rear surface electrodes (not shown) of the IGBTs 311 to 316 and FWDs 321 to 326 are connected to the metal patterns.

As the control ICs 41 to 44, molded ones may be used, or bare chips may be mounted. Also, at present, three control ICs 41 to 43 are used for a high side, and one control IC 44 is used for a low side, but it is possible to reduce the number of control ICs by using high voltage ICs for the low and high sides.

Figure 4:
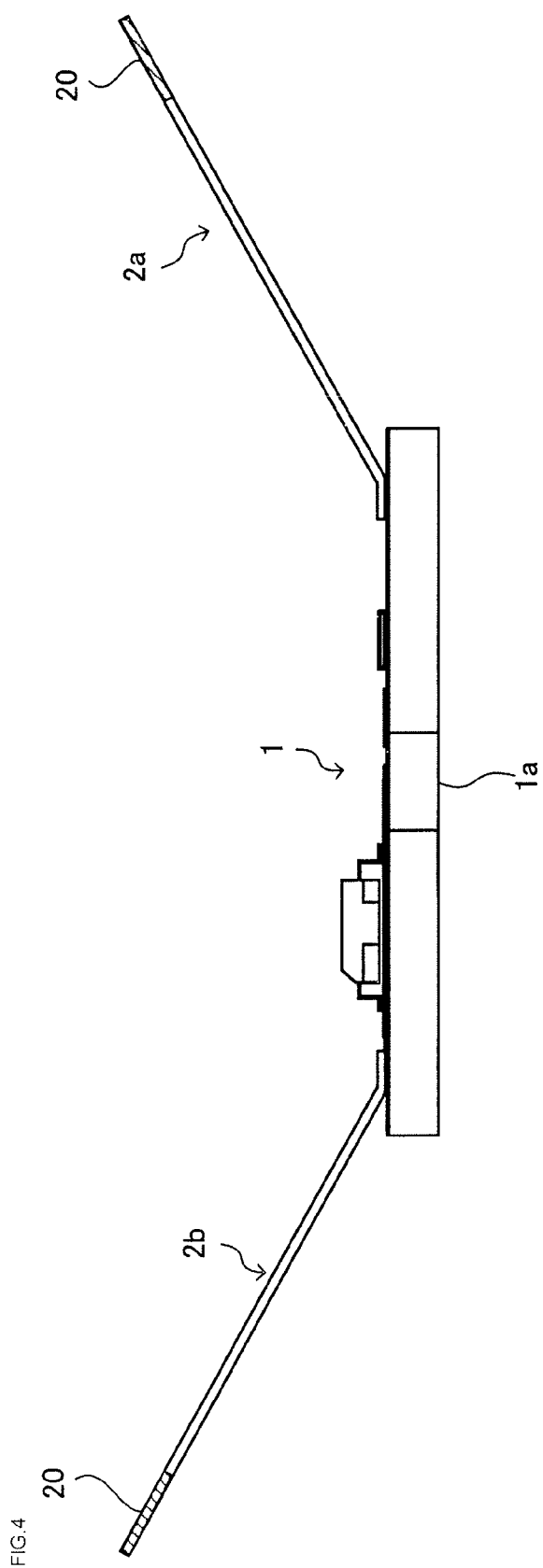
FIG. 4 is a front view showing positional relations in which the lead frames and the like and the insulating circuit board are bonded in the reflow soldering step.

FIG. 4 is a front view showing positional relations in which the lead frames and the like and the insulating circuit board are bonded together in the reflow soldering step.

The lead frame formation bodies 2a and 2b are formed plate-like, and as shown in FIG. 4, their respective internal terminals (inner leads) are bent in advance at an angle of in the order of 30° to 45°. Also, as shown in FIG. 3, each of the pair of lead frame formation bodies 2a and 2b is such that a plurality of leads is connected on an external terminal (outer lead) side by a tie bar 20.

Herein, the reason why soldered portions of the lead frame formation bodies 2a and 2b are bent slightly in advance is to prevent cracks from occurring in the bend portions when carrying out a primary bending work in step S20 to be described hereafter.

After the reflow soldering step, the process moves to a wire bonding step in step S18.

Figure 5:
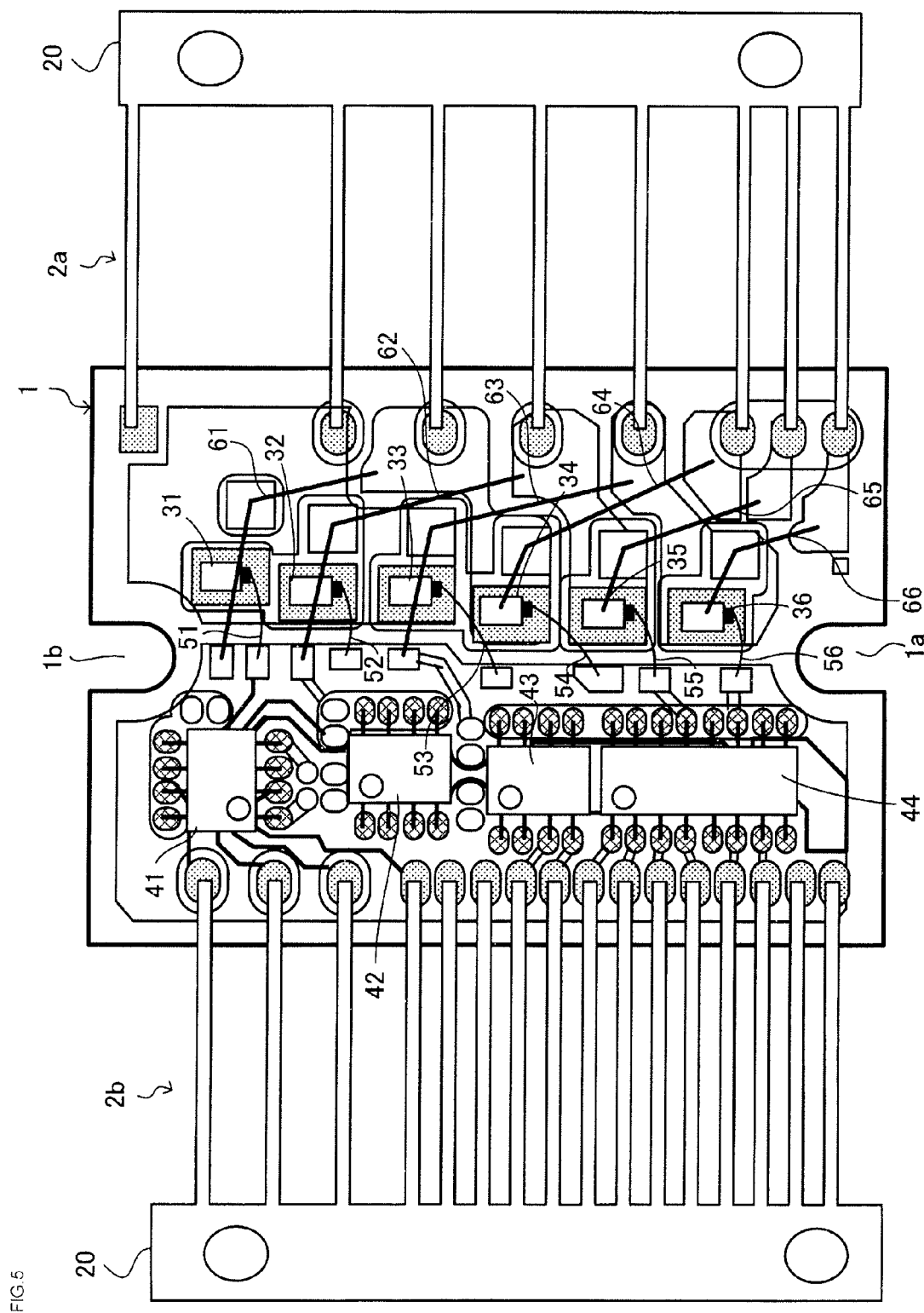
FIG. 5 is a plan view showing a wire bonding step.

FIG. 5 is a plan view showing the wire bonding step.

In the wire bonding step in step S18, metal patterns of the insulating circuit board 1, and metal patterns and corresponding power semiconductor chips, are connected in series by bonding wires. Metal patterns, the IGBT 311, and the FWD 321 are connected in series, thereby forming an inverse parallel circuit of the IGBT 311 and FWD 321. The IGBTs 312 to 316 and the respective FWDs 322 to 326 are also connected in series by bonding wires in the same way. Signal system wires 51 to 56 and power system wires 61 to 66, which are wires differing in diameter, are used as the bonding wires.

Herein, firstly, a wire bonding with the signal system wires 51 to 56 small in diameter is implemented, and subsequently, a wire bonding of power system terminals and electrode pads is implemented using the power system wires 61 to 66 large in diameter. This is because, by carrying out a wire bonding on the gate terminals of the IGBTs 311 to 316, static electricity accumulated therein is eliminated in advance. Also, when bonding, it is preferable to bend the wires to a certain degree of angle, rather than connecting them linearly.

Figure 6:
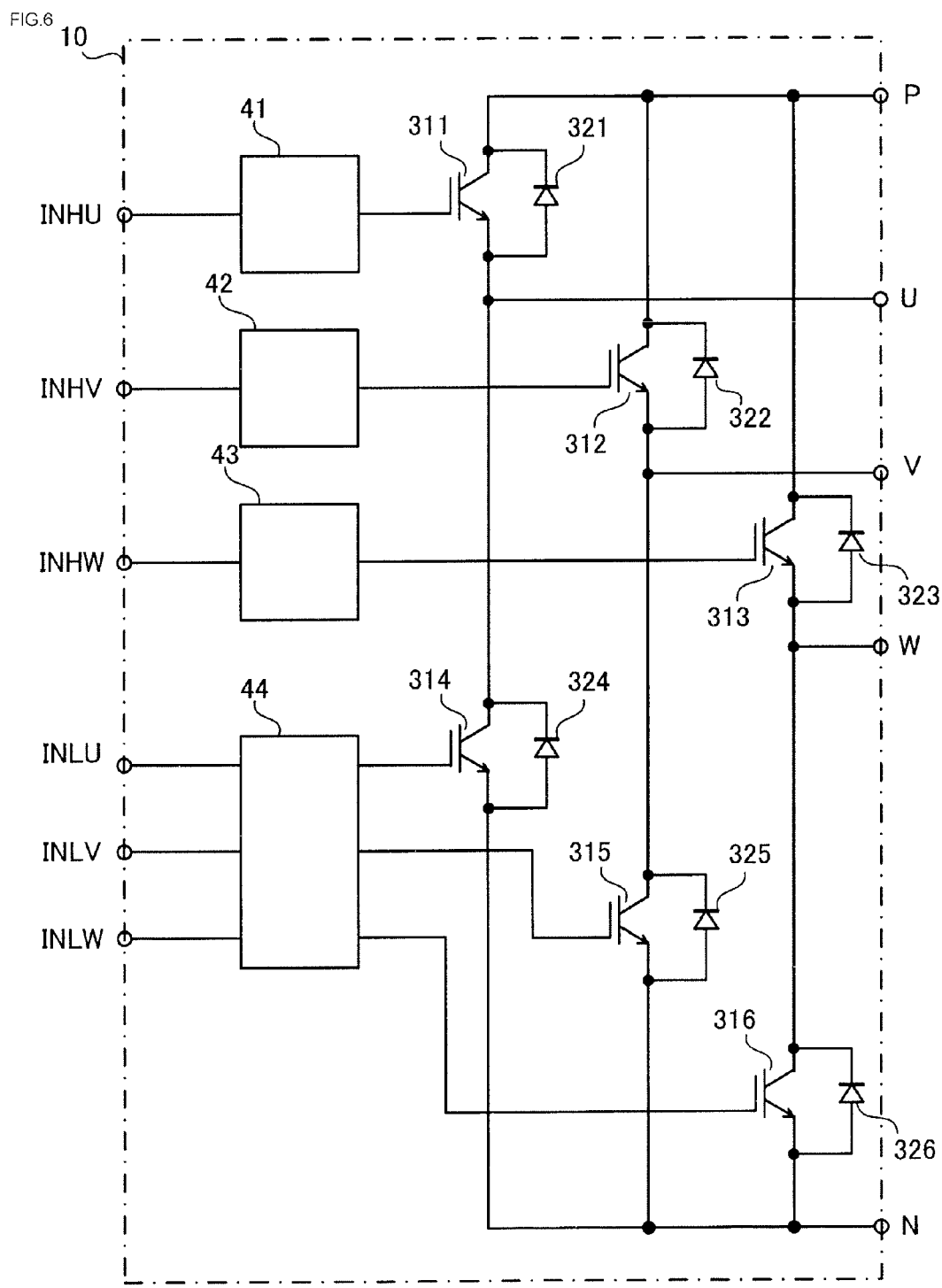
FIG. 6 is a diagram showing an equivalent circuit of a power converter circuit configured on the insulating circuit board shown in FIG. 3.

FIG. 6 is a diagram showing an equivalent circuit of a power converter circuit diagram configured on the insulating circuit board shown in FIG. 3. The circuit shown in FIG. 6 is configured by the heretofore described soldering and wire bonding.

In FIG. 6, INHU to INHV are input terminals leading to the high-side control ICs 41 to 43, and control signals from the IGBTs 311 to 313 are input into the INHU to INHV respectively. In the same way, INLU to INLW are input terminals leading to the low-side control IC 44, and control signals from the IGBTs 314 to 316 are input into the INLU to INLW.

Also, P and N are terminals connected to the positive and negative electrodes of an input direct current power supply, and U, V, and W are output terminals, but are terminals from which three-phase alternating current is output when this semiconductor module is applied to an inverter circuit.

In FIG. 6, as the illustration of supply terminals leading to the control ICs 41 to 44, a ground terminal, other control terminals, and the like, is omitted, the number of terminals does not coincide with that in the plan view shown in FIG. 3.

FIGS. 7(A), 7(B) are diagrams showing a shape of a terminal case for mounting the insulating circuit board, wherein FIG. 7(A) is a plan view thereof, and FIG. 7(B) is a sectional view taken along the line B-B of FIG. 7(A), looking in the direction of the arrows.

The terminal case 7 has a rectangular outer shape larger than the insulating circuit board 1 (shown by the phantom line in the same drawing FIG. 7(A)), and a resin filling portion 71 and a board housing portion 72 are provided in a central portion of a main body 70 as a through hole 73 having a stepped form in a height direction. That is, the resin filling portion 71 and board housing portion 72, as well as being formed in the upper and lower surfaces of the terminal case 7, are connected by the through hole 73. Also, as shown in FIG. 7(B), the upper resin filling portion 71 is formed to be slightly greater in width than the board housing portion 72, thus housing the insulating circuit board 1 in the condition shown in FIG. 8 to be described hereafter.

Also, groove portions 70a and 70b with L-shaped in section are formed in the respective long edge side inner surfaces of the resin filling portion 71 of the terminal case 7, and in positions corresponding to positions of leads on the insulating circuit board 1, to a size commensurate with the thickness of the leads of the lead frame formation bodies 2a and 2b. Herein, the size of the board housing portion 72 of the terminal case 7 has a shape commensurate with the lateral width W1 and longitudinal length W2 (refer to FIG. 1) of the insulating circuit board 1 mounted in the board housing portion 72. Because of this, by press inserting the insulating circuit board 1 into the board housing portion 72 of the terminal case 7, it is possible to securely fit the insulating circuit board 1 without using an adhesive.

Furthermore, the screw insertion holes 74a and 74b penetrating from the upper surface to the lower surface are formed in positions, on a pair of opposed edges of the main body 70 of the terminal case 7, matched with the notched portions 1a and 1b of the insulating circuit board 1.

It is preferable to form the terminal case 7 using a material with a thermal expansion coefficient value greater than at least that of the insulating circuit board 1. This is for preventing the insulating circuit board 1 press inserted in the board housing portion 72 of the terminal case 7 from deforming after a semiconductor device is assembled. Also, even in the event where the terminal case 7 expands when temperature rises to a value differing from that at an assembly point (that of ordinary temperature), the strength of close contact with the insulating circuit board 1 is maintained by a resin with which the terminal case 7 is filled in the way described hereafter.

The heretofore described terminal case 7 is prepared in step S19, and after the wire bonding in S18 has finished, the primary bending work of the lead frames is implemented in step S20.

Figure 8:
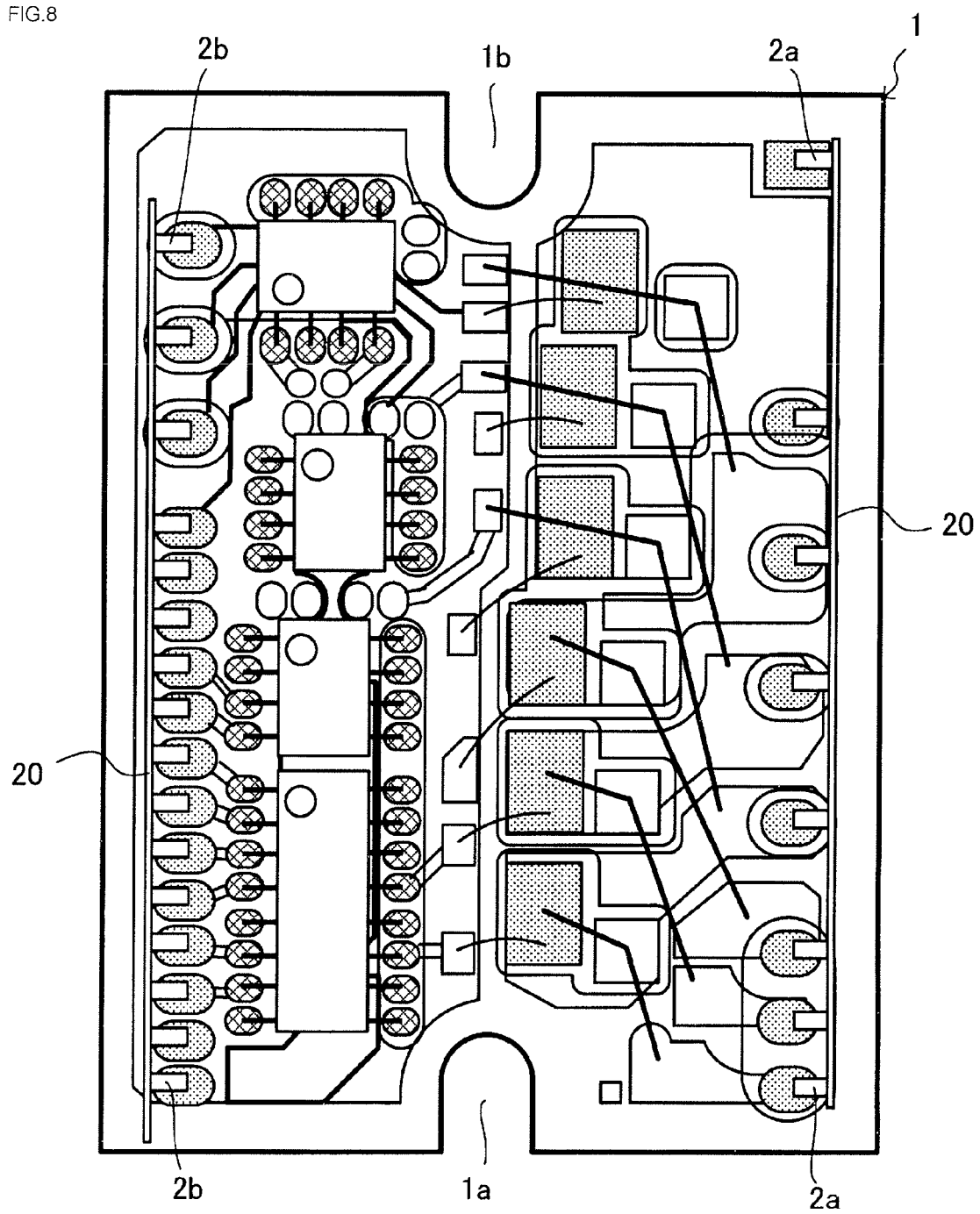
FIG. 8 is a plan view showing the insulating circuit board after a primary bending step which bends the lead frames vertically.

FIG. 8 is a plan view showing the insulating circuit board after a primary bending step which bends the lead frames vertically.

In this step S20, the lead frame formation bodies 2a and 2b are bent in the vicinity of the soldered portions of the respective internal terminals thereof so as to be substantially vertical to a main surface of the insulating circuit board 1. Consequently, as shown in the next FIG. 9, by press inserting the insulating circuit board 1 into the board housing portion 72 formed in the lower surface of the terminal case 7, the lead frame formation bodies 2a and 2b are disposed in a condition in which the external terminal (outer lead) sides are protruded toward the upper surface from the resin filling portion 71.

The individual leads of the lead frame formation bodies 2a and 2b are still connected by the tie bars 20 in this step S20.

Figure 9:
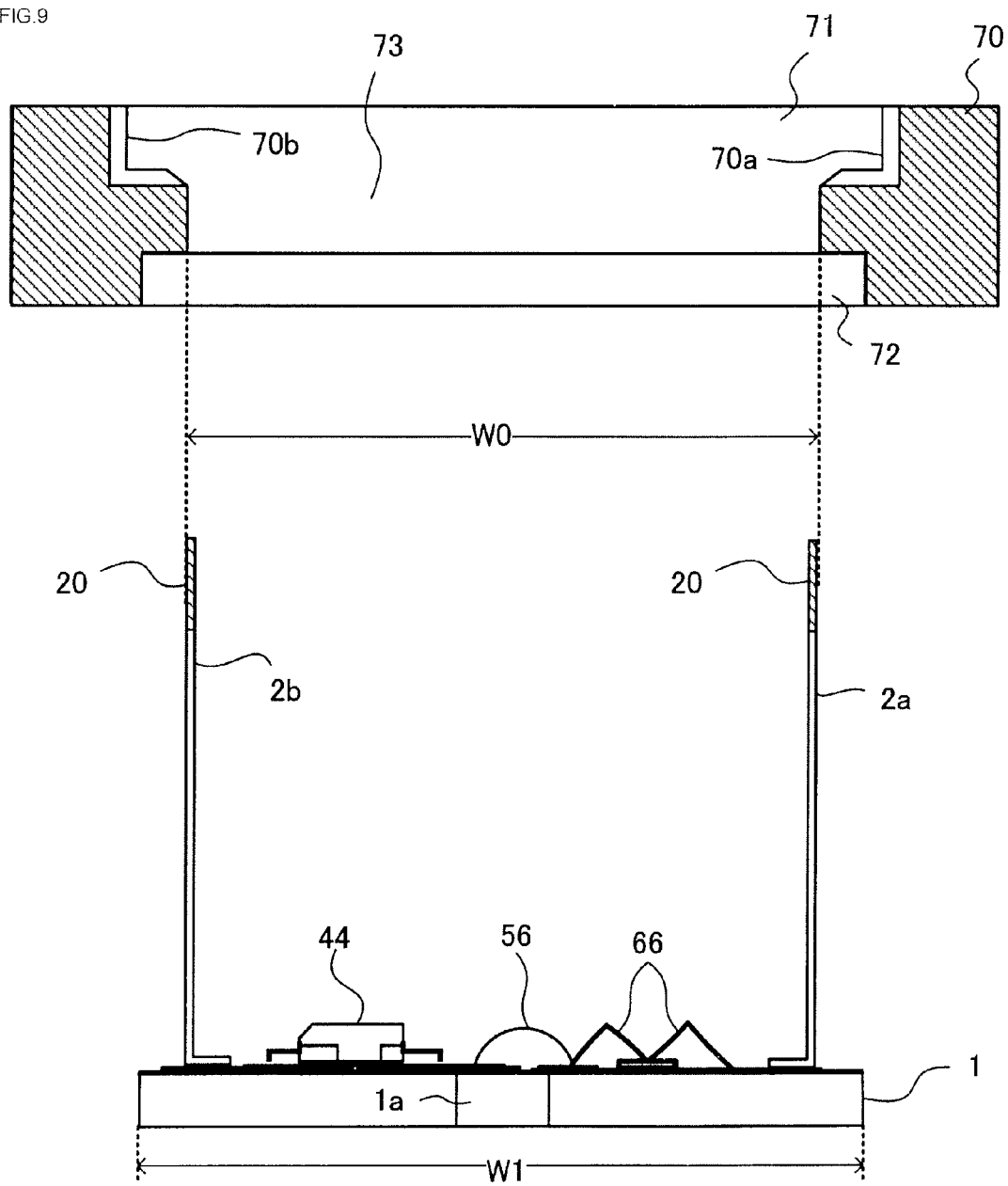
FIG. 9 is a front view showing a step of mounting the insulating circuit board to which the lead frames are bonded in the terminal case.

FIG. 9 is a front view showing a step of mounting the insulating circuit board having the lead frames bonded thereto in the terminal case.

In this step S21, the lead frame formation bodies 2a and 2b subjected to the primary bending work in S20, as well as the insulating circuit board 1, are mounted from the rear surface of the terminal case 7 formed in S19. FIG. 9 shows a condition immediately before the insulating circuit board 1 to which are bonded the lead frame formation bodies 2a and 2b is press inserted into the board housing portion 72 of the terminal case 7. The shape of the terminal case 7 is such that a left-right direction width (W4) of the through hole 73 connecting the resin filling portion 71 and board housing portion 72 is set to be equal to or slightly greater than a bonding distance (W0) between the two lead frame formation bodies 2a and 2b bonded to the top of the insulating circuit board 1 (W0≤W4).

Figure 10:
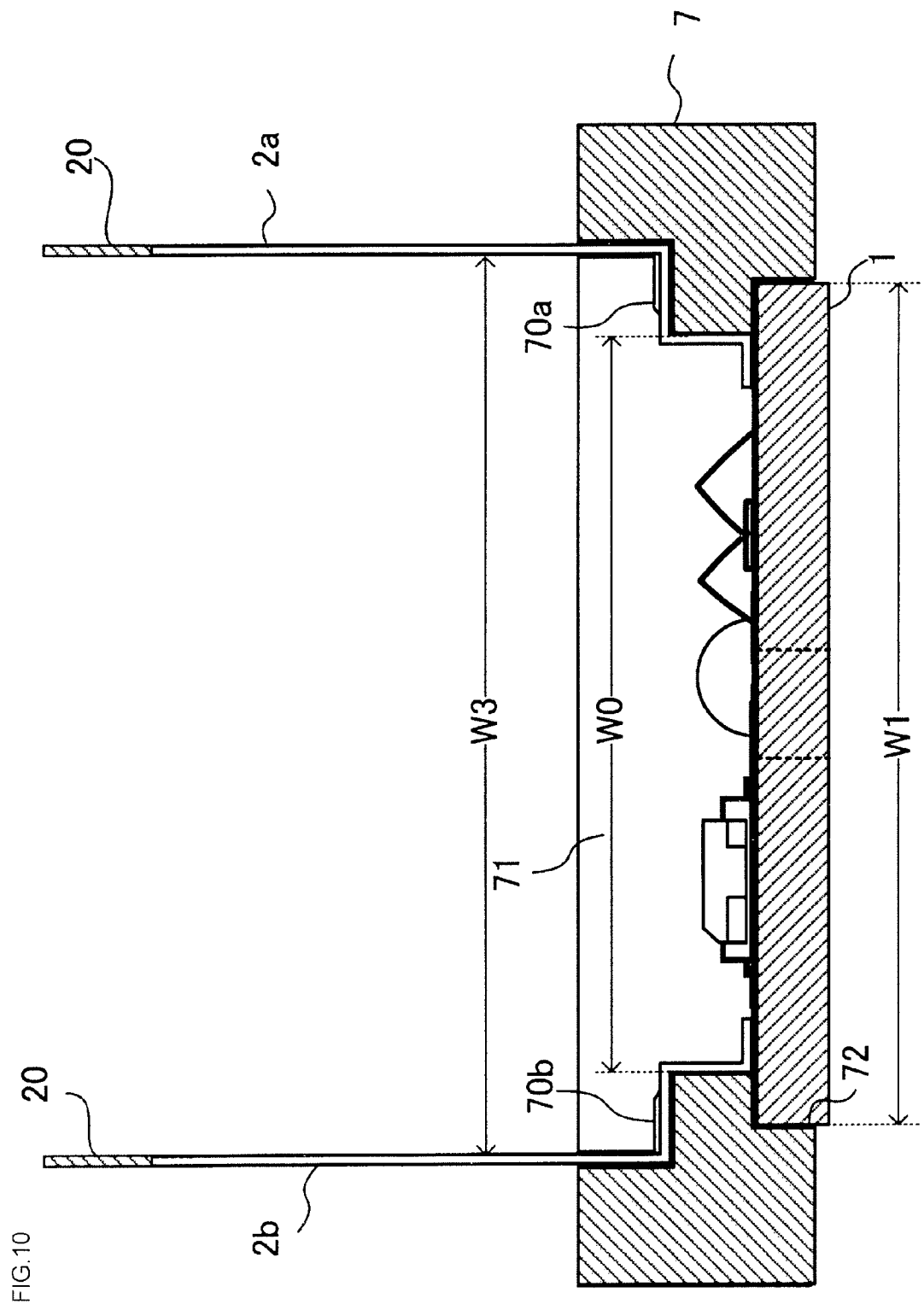
FIG. 10 is a front view showing a secondary bending step which bends the lead frames along inner side surfaces of the terminal case.

FIG. 10 is a front view showing a secondary bending step which bends the lead frames along the inner side surfaces of the terminal case.

In step S22, a secondary bending work of the lead frame formation bodies 2a and 2b is carried out.

The lead frame formation bodies 2a and 2b soldered to the insulating circuit board 1 with the lateral width W1 are raised substantially vertically from the soldered portions of the internal terminals (inner leads) by the primary bending work in step S20. In the secondary bending work of step S22, from this condition, the lead frame formation bodies 2a and 2b are further bent outward twice along the L-shaped groove portions 70a and 70b formed in the inner surfaces of the resin filling portion 71 of the terminal case 7. This means that the lead frame formation bodies 2a and 2b are bent in the direction parallel to the main surface of the insulating circuit board 1, and reach the horizontal portions of the L shapes of the groove portions 70a and 70b of the terminal case 7, and after the lead frame formation bodies 2a and 2b have been bent in the horizontal direction at the edges of the horizontal portions, the leading ends of the lead frame formation bodies 2a and 2b are bent in a vertical direction again by the vertical portions of the L shapes of the groove portions 70a and 70b.

Herein, as the internal terminal sides are fitted in the groove portions 70a and 70b of the terminal case 7, the lead frame formation bodies 2a and 2b whose leading ends are raised vertically are restrained by the groove portions 70a and 70b. Because of this, it is possible to prevent the internal terminals from falling in a direction parallel to the long edges of the terminal case (in the frontward direction or backward direction with respect to the plane of FIG. 10).

In this way, by the external terminal (outer lead) sides being regulated by the groove portions 70a and 70b of the terminal case 7, the lead frame formation bodies 2a and 2b are changed in shape into a form in which they are raised vertically in a condition in which their mutual separation is increased to a distance W3 (>W1), as shown in FIG. 10, from the distance W0 (<W1) between their bonding positions. Subsequently, the process moves to step S23, and by filling the resin filling portion 71 of the terminal case 7 with a molten resin, the metal patterns, signal system wires 51 to 56, power system wires 61 to 66, and the like, on the insulating circuit board 1 are shielded and protected from the air.

Herein, the example described using FIGS. 9 and 10 has been a case in which the bonding distance between the lead frame formation bodies 2a and 2b is equal to the left-right direction width of the through hole 73 (W0=W4). Because of this, portions of the lead frame formation bodies 2a and 2b raised vertically from the insulating circuit board 1 are contacting the sidewalls of a portion of the main body 70 of the terminal case 7 connecting the resin filling portion 71 and board housing portion 72. Because of this, when carrying out the heretofore described secondary bending step, it is possible to bend the lead frame formation bodies 2a and 2b along the terminal case 7 with the bending angle (right angle) of bend portions of the lead frame formation bodies 2a and 2b closest to the insulating circuit board 1 remaining as it is.

Figure 11:
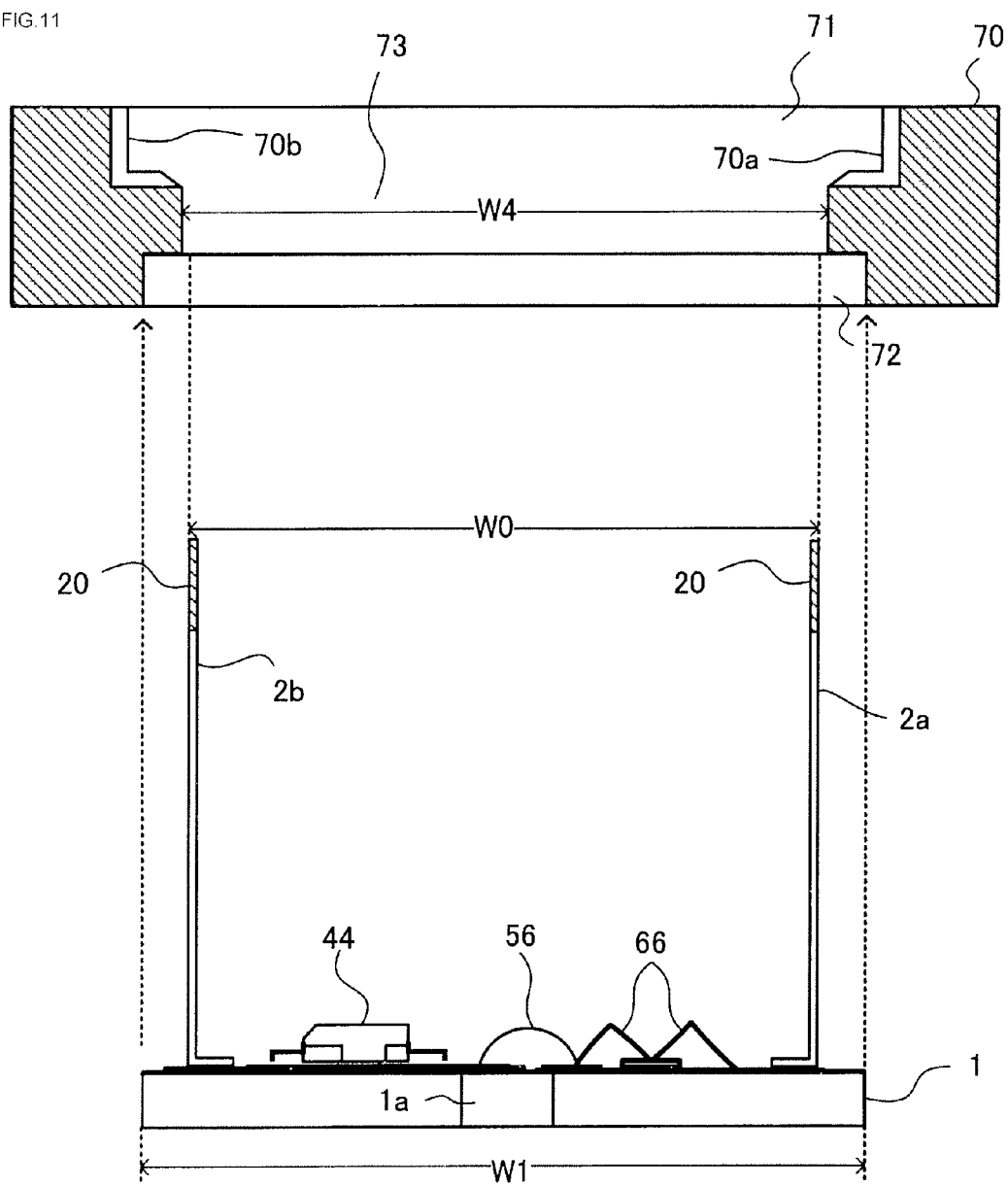
FIG. 11 is a front view showing the secondary bending step implemented in a relationship of W0<W4.
Figure 12:
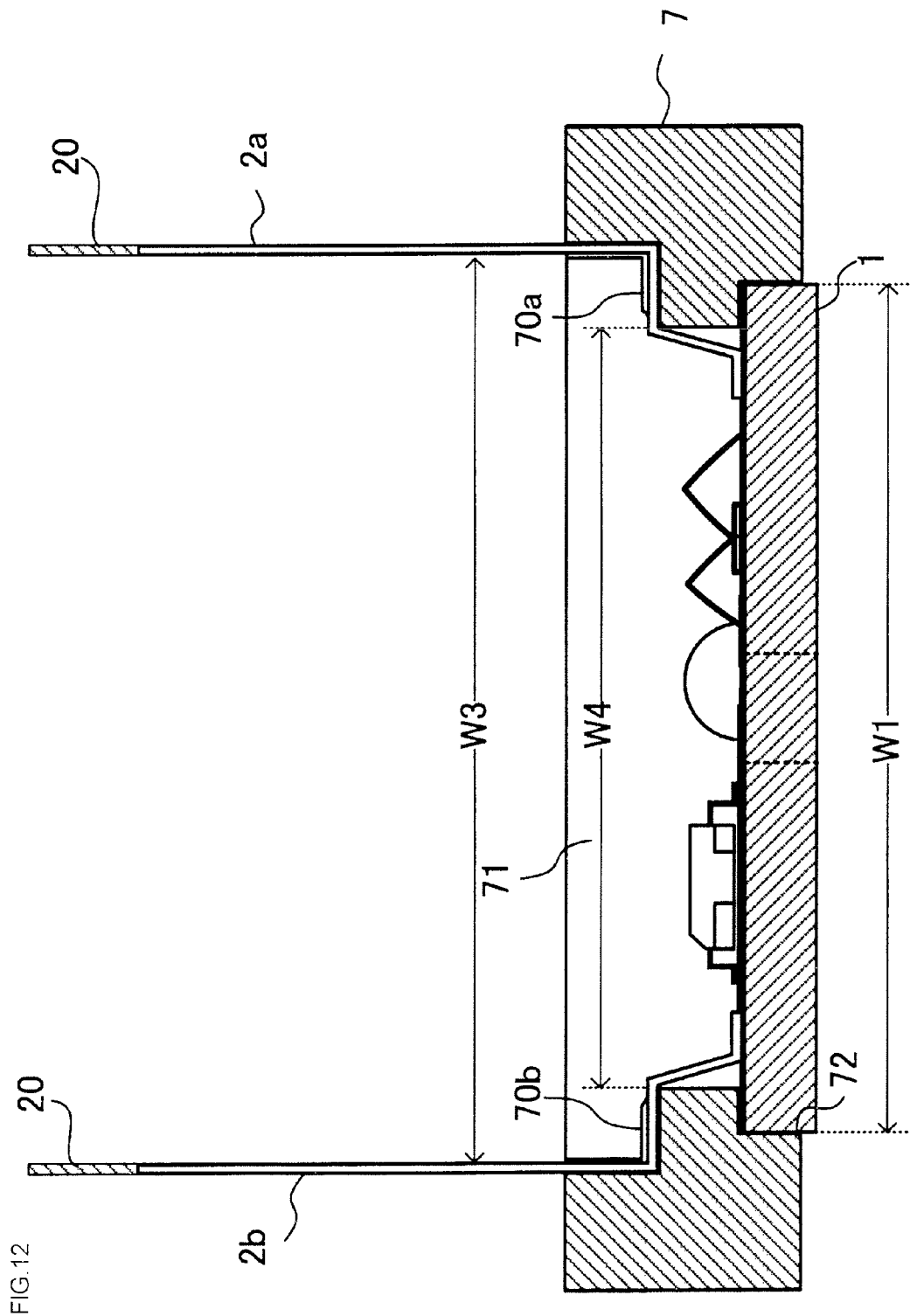
FIG. 12 is a sectional view showing a condition in which a front surface of the insulating circuit board in the terminal case is sealed with a resin.

FIG. 11 is a front view showing the secondary bending step implemented in a relationship of W0<W4, and FIG. 12 is a sectional view showing a condition in which a surface of the insulating circuit board in the terminal case is resin sealed.

In the secondary bending step, a configuration may be adopted as shown in the heretofore described FIGS. 9 and 10, but it is good to dispose the lead frame formation bodies 2a and 2b on the insulating circuit board 1 so as to establish the relationship of W0<W4, and to insert the insulating circuit board 1 into the main body 70 of the terminal case 7 as shown in FIGS. 11 and 12. By so doing, even when there is a minute misalignment in a step of joining the lead frame formation bodies 2a and 2b to the insulating circuit board 1, or even when there is a minute variation in the degree of bending precision when carrying out the primary bending work, it is possible to prevent the lead frame formation bodies 2a and 2b from abutting against the terminal case when fitting the insulating circuit board 1 into the board housing portion 72 of the main body 70 of the terminal case 7. Thus, assembly work becomes easier, and it is possible to prevent the lead frame formation bodies 2a and 2b from deforming.

In the secondary bending step shown in FIG. 11, the bending work is carried out while abutting the internal terminal portions of the lead frame formation bodies 2a and 2b against the main body 70 of the terminal case 7 by tilting the internal terminal portions raised vertically by the primary bending work outward again from the vicinity of the portions joined to the insulating circuit board. At this time, by an unshown upper die being pressed against the lead frames with L-shaped stepped portions formed in the inner surfaces of the resin filling portion 71 of the terminal case 7 as lower dies, it is possible to bend the lead frames along the L-shaped stepped portions.

Then, the external terminals are raised vertically with respect to the insulating circuit board 1 while fitting the internal terminals in the groove portions 70a and 70b of the terminal case 7. Subsequent steps are the same as in the case described in the previously described FIGS. 9 and 10.

In this way, as the lead frame formation bodies 2a and 2b are resin sealed in the L-shaped groove portions 70a and 70b, the horizontal portions of the lead frame formation bodies 2a and 2b bear stress from a force attempting to pull the lead frame formation bodies 2a and 2b out from the terminal case 7, and no stress in a direction in which the lead frame formation bodies 2a and 2b are pulled out from the insulating circuit board 1 is transmitted to the soldered portions of the inner leads. Also, as the horizontal portions of the lead frame formation bodies 2a and 2b are supported by the groove portions 70a and 70b of the terminal case 7 even when a force to depress the leads of the lead frame formation bodies 2a and 2b acts on the lead frame formation bodies 2a and 2b, no stress in a direction in which the leads are depressed is transmitted directly to the soldered portions of the inner leads.

Figure 13:
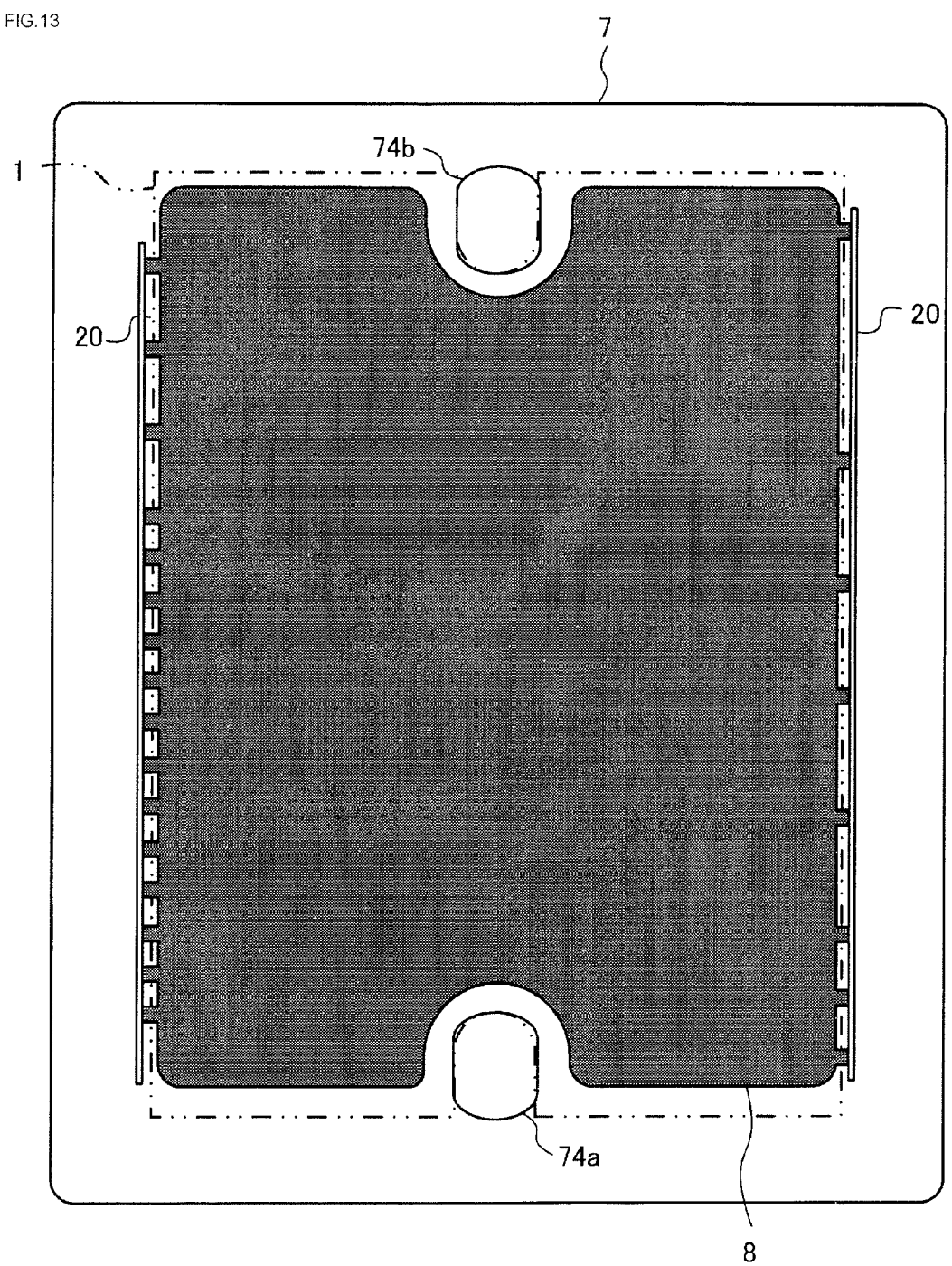
FIG. 13 is a sectional view showing a condition in which the front surface of the insulating circuit board in the terminal case is resin sealed.
Figure 14:
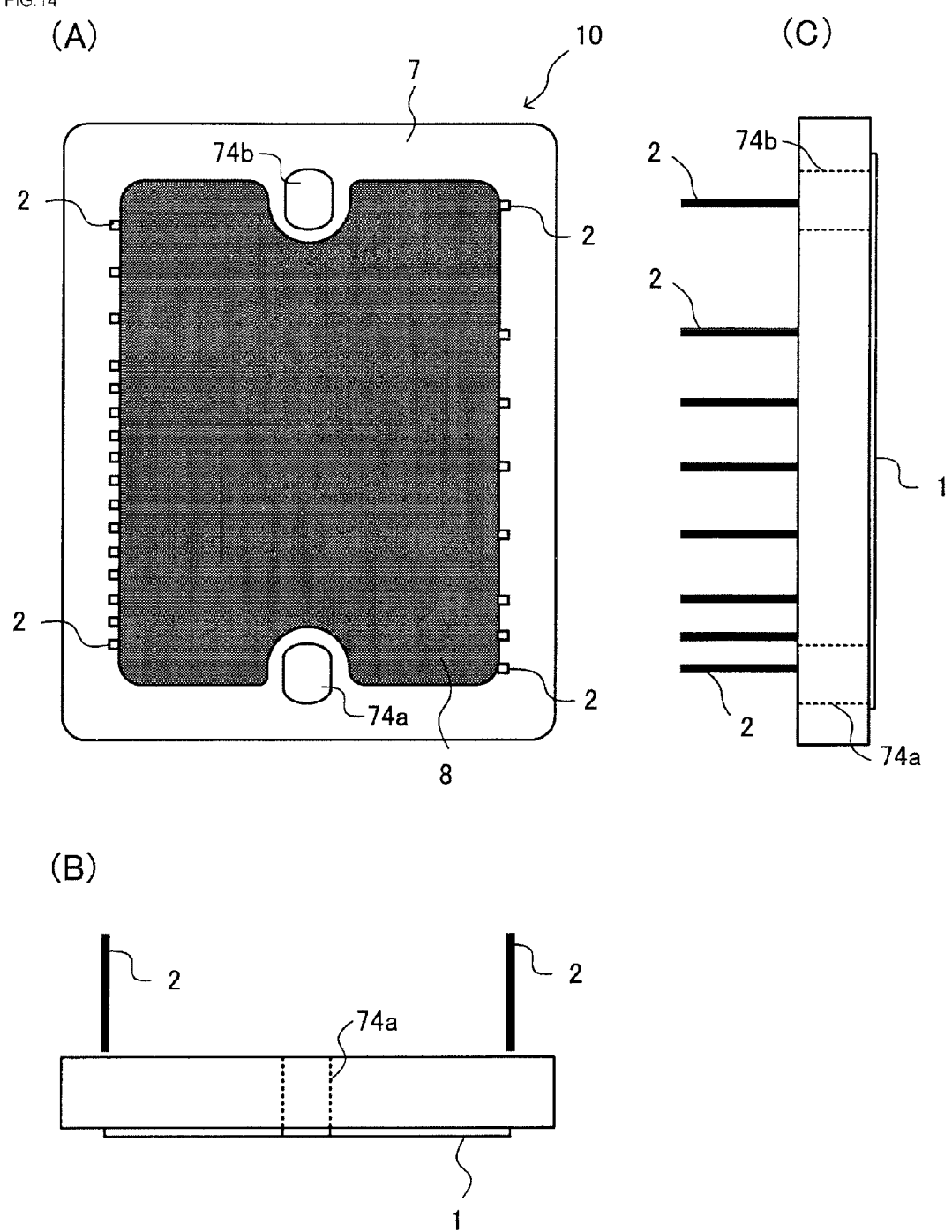
FIGS. 14(A)-14(C) illustrate a plan view, front view, and side view showing an external shape of a completed semiconductor device.

FIG. 13 is a sectional view showing a condition in which a surface of the insulating circuit board in the terminal case is resin sealed.

Herein, after preheating has been carried out on the terminal case 7, the inside of the resin filling portion 71 of the terminal case 7 is injected with a molten thermosetting resin, for example, an epoxy resin 8. At this time, by forming a slight gap between the insulating circuit board 1 and the board housing portion 72 of the terminal case 7 in advance, it is possible to stably hold the insulating circuit board 1 in the terminal case 7 due to the epoxy resin 8 with which the gap is filled.

In this condition, the epoxy resin 8 is hardened by being cured in a furnace. In this way, the epoxy resin 8 is stably held by the resin filling portion 71 of the terminal case 7. In order to prevent the epoxy resin 8 from separating from the power semiconductor chips 311 to 316 and 321 to 326 and lead frame formation bodies 2a and 2b due to thermal expansion, it is preferable that a resin with substantially the same thermal expansion coefficient as that of the power semiconductor chips and lead frame formation bodies is selected as the epoxy resin 8.

Finally, in step S24, the lead frame formation bodies 2a and 2b are cut off from the tie bars 20, and separated into the individual outer leads.

FIGS. 14(A)-14(C) illustrate a plan view, front view, and side view showing an external shape of a completed semiconductor device.

The external terminal sides of the lead frame formation bodies 2a and 2b are press worked vertically, and furthermore, the tie bars 20 are cut off, and the leads are cut and separated from each other, thereby forming the external terminals 2, as shown in FIGS. 14(A)-14(C). That is, the external terminals 2 are configured from one end portion of each of the lead frame formation bodies 2a and 2b.

A power semiconductor module 10 is configured by the insulating circuit board 1, the power semiconductor chips and control ICs mounted on the insulating circuit board 1, and the external terminals 2 for connecting the chips and ICs and a control circuit board being housed in the terminal case 7, and the inside of the terminal case 7 being sealed with the epoxy resin 8. A radiating surface of the insulating circuit board 1 is abutted against cooling fins or the like. As the inside of the terminal case 7 is sealed with the epoxy resin 8, the insulating circuit board, semiconductor chips, and the like, are not presented in the same drawing.

An example wherein the epoxy resin 8 is used as an insulating sealant has been shown here, but a gel filler such as, for example, silicone gel may be injected into the terminal case 7 and hardened. However, an epoxy resin is preferred as it is superior in thermal conductivity and thermal resistance, and also higher in rigidity. When using a gel filler, it is necessary to consider measures such as holding down the upper surface thereof with a resin plate or the like.

In the embodiment, the semiconductor device has been configured in a form of a DIP type wherein the external terminals 2 are extended from both sides surface of the terminal case 7, but can also be configured in a SIP type wherein the external terminals 2 are extended from one side surface, in a QFP type wherein the terminals are extended from the upper surface, or in other forms.

Figure 15:
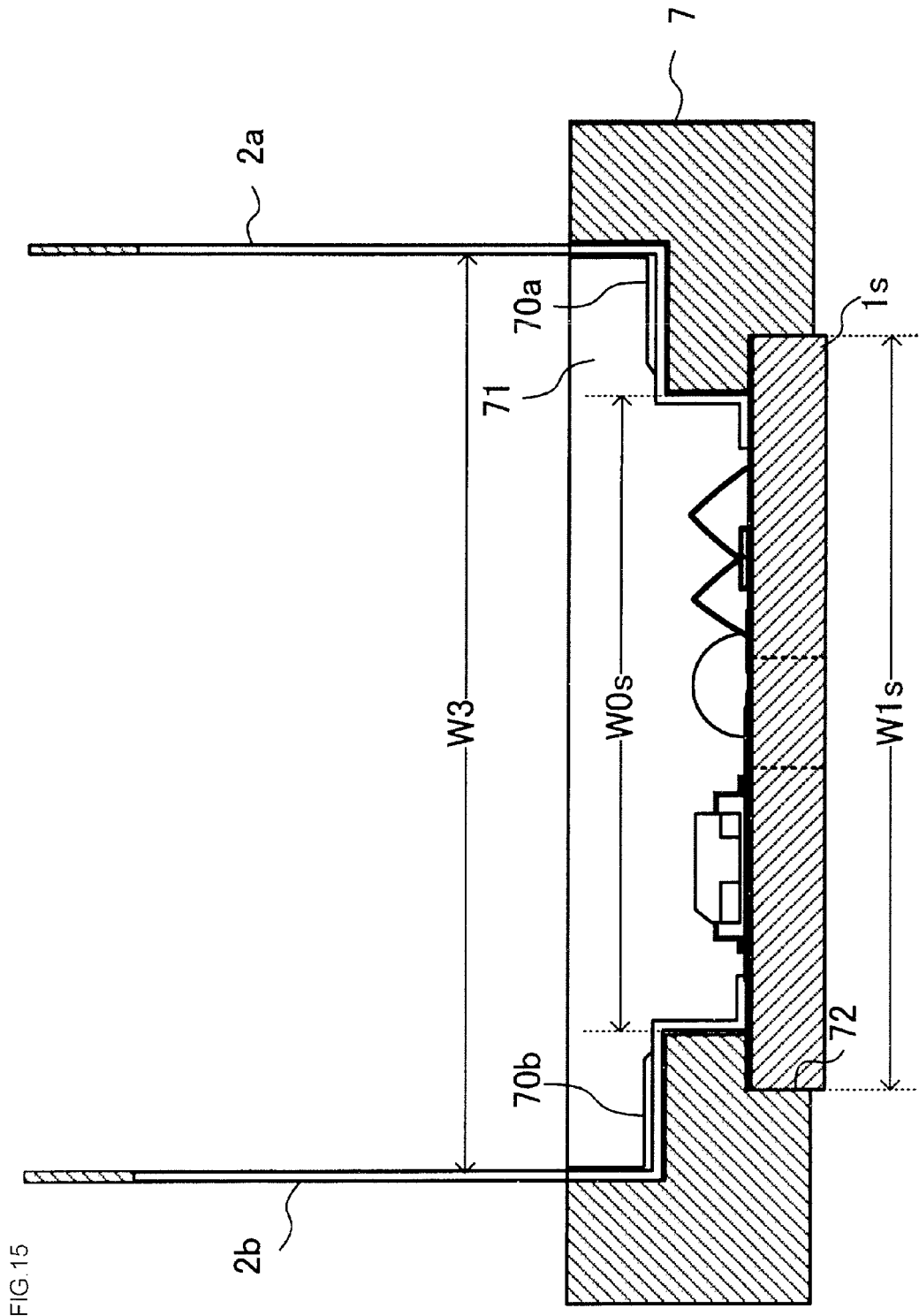
FIG. 15 is a front view showing a semiconductor device according to the embodiment assembled using an insulating circuit board differing in size from that in FIG. 13.
Figure 16:
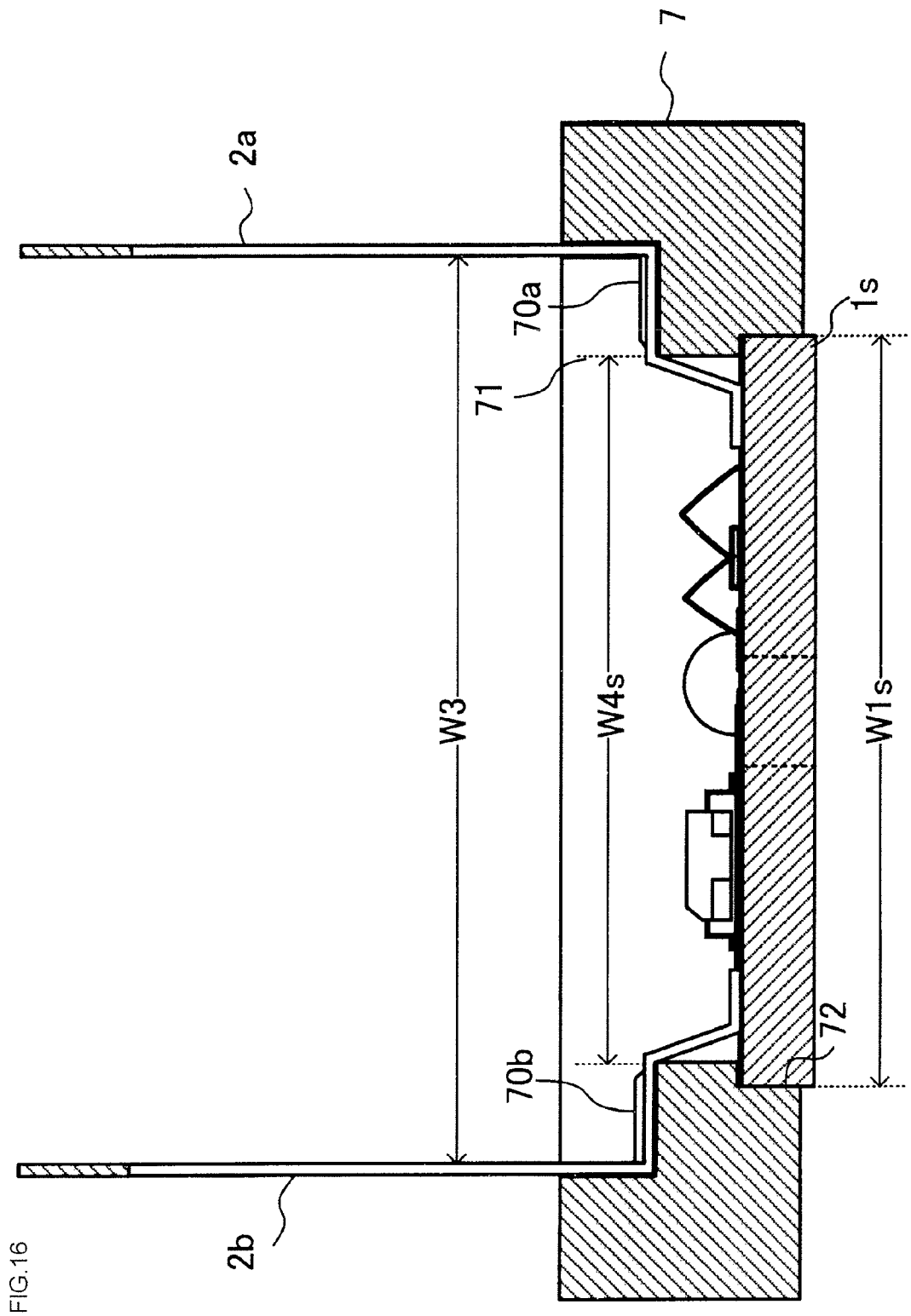
FIG. 16 is a front view showing a semiconductor device according to the embodiment assembled using an insulating circuit board differing in size from that in FIG. 12.

FIGS. 15 and 16 are front views each showing a semiconductor device according to the embodiment assembled using an insulating circuit board differing in size from that in FIGS. 13 and 12.

Herein, the external dimensions of the terminal case 7 correspond to those of the terminal case 7 used in the secondary bending work of the lead frame formation bodies 2a and 2b shown in FIG. 10. However, by power semiconductor chips and control ICs soldered to an insulating circuit board is being reduced in size, a lateral width W1s of the insulating circuit board 1s becomes smaller in comparison with that in FIG. 1. Also, although not shown in FIG. 15, the longitudinal length of the insulating circuit board 1s also becomes smaller than W2.

That is, the insulating circuit board 1 shown in FIG. 1 is of a rectangular shape of which the lateral width is W1 and the longitudinal length is W2 (>W1), but the insulating circuit board 1s shown in FIG. 15 is formed so that the lateral width W1s is smaller than the lateral width W1 of the insulating circuit board 1. In the same way, a width direction size W1s (<W1) of the board housing portion 72 provided in the terminal case 7 and a distance W0s between positions in which the lead frame formation bodies 2a and 2b are bonded to the insulating circuit board 1s also become smaller. Consequently, by forming the resin filling portion 71 of the terminal case 7 in FIG. 15 to the same size as that in FIG. 10, the L-shaped horizontal portions of the L-shaped groove portions 70a and 70b formed in the inner surfaces of the resin filling portion 71 are simply formed to be greater in length, while a distance W3 (>W1s) between the lead frame formation bodies 2a and 2b protruding from the resin filling portion 71 of the terminal case 7 is maintained exactly the same.

In this way, even in the event where circuit patterns are changed along with the reduction in size of the insulating circuit board 1s, and the soldering positions of the inner leads are thus changed, the length of the inner lead side horizontal portions of the lead frame formation bodies 2a and 2b is simply changed, and there is no more need to change the lead out positions of the external terminals.

That is, as shown in FIGS. 10 and 15 or FIGS. 12 and 16, the external terminals (portions vertical to the insulating circuit board) led out from the resin filling portion are positioned outside a position in which the outer peripheral edge of the insulating circuit board is projected upward. Because of this, even when the length of the horizontal portions is changed on the inner lead sides in the way heretofore described, there is no need to change the lead out positions of the external terminals (for example, the positions of, and the distance between, the individual external terminals with the screw insertion holes 74a and 74b as references).

As heretofore described, with the power semiconductor module 10 completed in the embodiment, the external terminals 2 configured by the lead frame formation bodies 2a and 2b can be led out externally from the same positions despite a change in size of the insulating circuit board 1. Consequently, even when the insulating circuit board is reduced in size, it is possible to correspond without changing the size of the lead frames themselves. Moreover, as it is possible to configure a semiconductor device by incorporating an insulating circuit board differing in size without changing the positions from which the lead frames are led out externally, there is no more need for a change in position in a step of mounting the semiconductor device on the control circuit board.

A description has heretofore been given of preferred embodiments of the invention, but it goes without saying that the invention, not being limited to a specific embodiment thereof, can be altered and implemented without departing from the scope of the invention.

The heretofore described simply illustrates the principle of the invention. Furthermore, the invention, many modifications and alterations of which can be made by those skilled in the art, is not limited to the heretofore illustrated and described exact configurations and applications, and corresponding modification examples and equivalents are all deemed to be in the scope of the invention encompassed by the appended claims and their equivalents.

What is claimed is:

1. A semiconductor device comprising:
   an insulating circuit board mounted with a plurality of power semiconductor elements and control integrated circuits controlling the power semiconductor elements;
   lead frames each including an external terminal on one end side, and an internal terminal connected to the insulating circuit board on another end side;
   a terminal case holding an internal terminal side of each of the lead frames, and including a board housing portion on one side to house the insulating circuit board, a resin filling portion on another side opposite to the one side, and a through hole connecting the resin filling portion and the board housing portion; and
   a resin to seal an inside of the terminal case and a connecting surface of the insulating circuit board connected to the lead frames,
   wherein each of the lead frames extends from the insulating circuit board to an outside of the terminal case through the through hole and the resin filling portion of the terminal case, and extends along an inner side surface of the resin filling portion to have an L-shape,
   lead out positions of the external terminal are maintained constant regardless of positions where the insulating circuit board and the lead frames are connected in the terminal case,
   the inner side surface of the resin filling portion of the terminal case is formed with a plurality of groove portions corresponding to the lead out positions of the lead frames, and portions of the lead frames perpendicular to the insulating circuit board and continuous with the external terminals are fitted in the groove portions,
   the inner side surface of the resin filling portion includes a first side surface having one edge connected to an inner surface of the through hole and extending horizontally in a direction away from a center of the insulating circuit board, and a second side surface having one edge extending vertically from another edge of the first side surface to the outside of the terminal case, and
   the board housing portion has a width greater than that of the through hole, and less than that of the resin filling portion.

2. A semiconductor device according to claim 1, wherein the inner side surface of the resin filling portion of the terminal case is L-shaped, and each of the lead frames is bent along the L-shaped inner side surface.

3. A semiconductor device according to claim 1, wherein the lead frames bent into the L-shape are vertical to the insulating circuit board, and the portions continuous with the external terminals are positioned outside a position where an outer peripheral end portion of the insulating circuit board is projected upward.

4. A semiconductor device according to claim 1, wherein the through hole has the width equal to a bonding distance between the lead frames in a width direction of the insulating circuit board, and each of the lead frames extends vertically from the insulating circuit board along the inner surface of the through hole, horizontally along the first side surface of the resin filling portion, and vertically along the second side surface of the resin filling portion toward the outside of the terminal case.

5. A semiconductor device according to claim 1, wherein the through hole has a width greater than a bonding distance between the lead frames in a width direction of the insulating circuit board, and each of the lead frames is inclined to extend from the insulating circuit board through the through hole toward the one edge of the first side surface of the resin filling portion, and extends horizontally along the first side surface of the resin filling portion and vertically along the second side surface of the resin filling portion toward the outside of the terminal case.

6. A manufacturing method of a semiconductor device comprising:

a step of preparing a terminal case including a board housing portion on one side to house an insulating circuit board, a resin filling portion on another side, and a through hole connecting the board housing portion and the resin filling portion, wherein the resin filling portion is formed with a first side surface having one edge connected to an inner surface of the through hole and extending horizontally in a direction away from a center of the insulating circuit board, and a second side surface having one edge extending vertically from another edge of the first side surface to an outside of the terminal case, a step of solder joining a plurality of power semiconductor elements, control integrated circuits controlling the power semiconductor elements, and lead frames to the insulating circuit board;

a primary bending step bending the lead frames vertically with respect to a main surface of the insulating circuit board so that the lead frames are positioned to protrude through the through hole;

a step of mounting the insulating circuit board in the board housing portion of the terminal case;

a secondary bending step outwardly bending the lead frames raised vertically in the primary bending step, and bending the lead frames horizontally along the first side surface of the resin filling portion of the terminal case, and vertically along the second side surface of the resin filling portion toward the outside of the terminal case by pressing an upper die against the first and second side surfaces of the lead frames defined as lower dies; and a step of filling the resin filling portion with a sealing resin.

7. A manufacturing method of a semiconductor device according to claim 6, wherein the through hole is formed to have a width greater than a bonding distance between the lead frames in a width direction of the insulating circuit board, and each of the lead frames is bent to incline toward the one edge of the first side surface of the resin filling portion between the primary bending and the secondary bending.

\* \* \* \* \*